US006950337B2

(12) United States Patent
Bellini et al.

(10) Patent No.: US 6,950,337 B2
(45) Date of Patent: Sep. 27, 2005

(54) NONVOLATILE MEMORY DEVICE WITH SIMULTANEOUS READ/WRITE

(75) Inventors: Andrea Bellini, Gorgonzola (IT); Mauro Sali, Sant'angelo Lodigiano (IT); Alessandro Magnavacca, Sesto San Giovanni (IT); Carlo Lisi, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 72 days.

(21) Appl. No.: 10/719,650

(22) Filed: Nov. 21, 2003

(65) Prior Publication Data

US 2004/0156235 A1 Aug. 12, 2004

(30) Foreign Application Priority Data

Nov. 29, 2002 (IT) ..................................... TO2002A1035

(51) Int. Cl.[7] .............................................. G11C 16/00
(52) U.S. Cl. ............................ 365/185.13; 365/189.04; 365/185.22
(58) Field of Search ....................... 365/185.13, 185.22, 365/185.23, 189.04

(56) References Cited

U.S. PATENT DOCUMENTS

| 4,875,189 A | * | 10/1989 | Obara | ................... | 365/189.04 |
| 5,847,994 A | | 12/1998 | Motoshima et al. | ... | 365/185.11 |
| 5,847,998 A | | 12/1998 | Van Bushkirk | ........ | 365/185.33 |
| 5,894,437 A | | 4/1999 | Chang et al. | .......... | 365/185.13 |
| 6,016,270 A | | 1/2000 | Thummalapally et al. | ...................... | 365/185.11 |
| 6,031,785 A | * | 2/2000 | Park et al. | ............. | 365/230.08 |
| 6,331,950 B1 | * | 12/2001 | Kuo et al. | ............. | 365/185.18 |
| 2002/0131301 A1 | | 9/2002 | Elmhurst | ............... | 365/185.11 |

FOREIGN PATENT DOCUMENTS

EP        0 745 995 A1    12/1996

OTHER PUBLICATIONS

Pathak, B., et al., "A 1.8V 64Mb 100Mhz Flexible Read While Write Flash Memory," in *Proceedings of the IEEE International Solid–State Circuits Conference*, Piscataway, NJ, Feb. 5–7, 2001, pp. 32–33, 424–425.

* cited by examiner

*Primary Examiner*—Tan T. Nguyen
(74) *Attorney, Agent, or Firm*—Lisa K. Jorgenson; David V. Carlson; Seed IP Law Group PLLC

(57) ABSTRACT

A nonvolatile memory device with simultaneous read/write has a memory array formed by a plurality of cells organized into memory banks, and a plurality of first and second sense amplifiers. The device further has a plurality of R/W selectors associated to respective sets of cells and connecting the cells of the respective sets of cells alternately to the first sense amplifiers and to the second sense amplifiers.

14 Claims, 3 Drawing Sheets ately, the memory array cannot be divided into a large number of sections. In fact, since each section should be associated to a respective bank of sense amplifiers, fractioning of the memory also entails an increase in the overall dimensions of the device; the more the memory is fractioned, the greater the overall dimensions. Consequently, the memory arrays normally comprise two or at the most four sections. On the other hand, the low fractioning of the memory causes simultaneous access to reading and writing to be relatively infrequent and thus far from effective. In any case, in fact, it is not possible to simultaneously read and write cells belonging to the same section.

US 6,950,337 B2

NONVOLATILE MEMORY DEVICE WITH SIMULTANEOUS READ/WRITE

BACKGROUND OF THE INVENTION

1. Field of the Invention

The present invention relates to a nonvolatile memory device with simultaneous read/write.

2. Description of the Related Art

To optimize read/write performance of nonvolatile memory devices, it is extremely important to be able to execute parallel read/write operations on more than one cell. Various solutions are known to the art which enable increase of the number of memory cells that are selected simultaneously to be read or written (page read/write or "burst mode"). The same type of operation, either read or write, is usually performed on all of the cells selected.

During reading, in practice, the selected cells are connected to respective sense amplifiers, which compare the threshold voltages of the cells with the threshold voltages of respective reference cells.

During writing, which may envisage programming or erasing of the selected cells, a cycle comprising two steps is executed at least once. Initially, the selected cells are biased with preset voltages and/or biasing currents so as to modify their threshold voltages. Then, reading is performed to verify the value actually reached by the threshold voltages. If this value is insufficient, the cycle is repeated. Moreover, in the case of multilevel memories, it is in any case necessary to execute more than one cycle.

Writing cannot in general be performed simultaneously with reading. In fact, during verifying of the threshold voltages, the cells must be connected to the sense amplifiers, which thus are not available for reading other cells. In addition, verifying is performed synchronously with an internal timing signal of the memory devices, while ordinary reading is asynchronous. It is consequently evident that also the driving signals and reference signals are different for verifying and reading.

To overcome the described drawbacks, architectures of nonvolatile memories have been proposed which enable simultaneous reading on a first set of cells and writing on a second set of cells (dual working). According to these solutions, in practice, the memory array is divided into sections, and associated to each section is a set or bank of sense amplifiers and a column decoder circuit. The banks of sense amplifiers are independent of one another and thus may be driven simultaneously in different ways. More precisely, while a first bank of sense amplifiers is driven in a synchronous way (verify), a second bank may be driven in an asynchronous way (read). In this way, it is therefore possible to perform simultaneously read and write operations, provided that cells are selected belonging to distinct sections of the memory.

BRIEF SUMMARY OF THE INVENTION

The aim of the present invention is to provide a memory device free from the limitations outlined above.

According to the present invention a nonvolatile memory device with simultaneous read/write is provided as defined in claim 1.

BRIEF DESCRIPTION OF THE DRAWINGS

For a better understanding of the invention, some embodiments thereof are now described, purely by way of non-limiting example and with reference to the attached drawings, wherein.

DETAILED DESCRIPTION OF THE INVENTION

Figure 1:
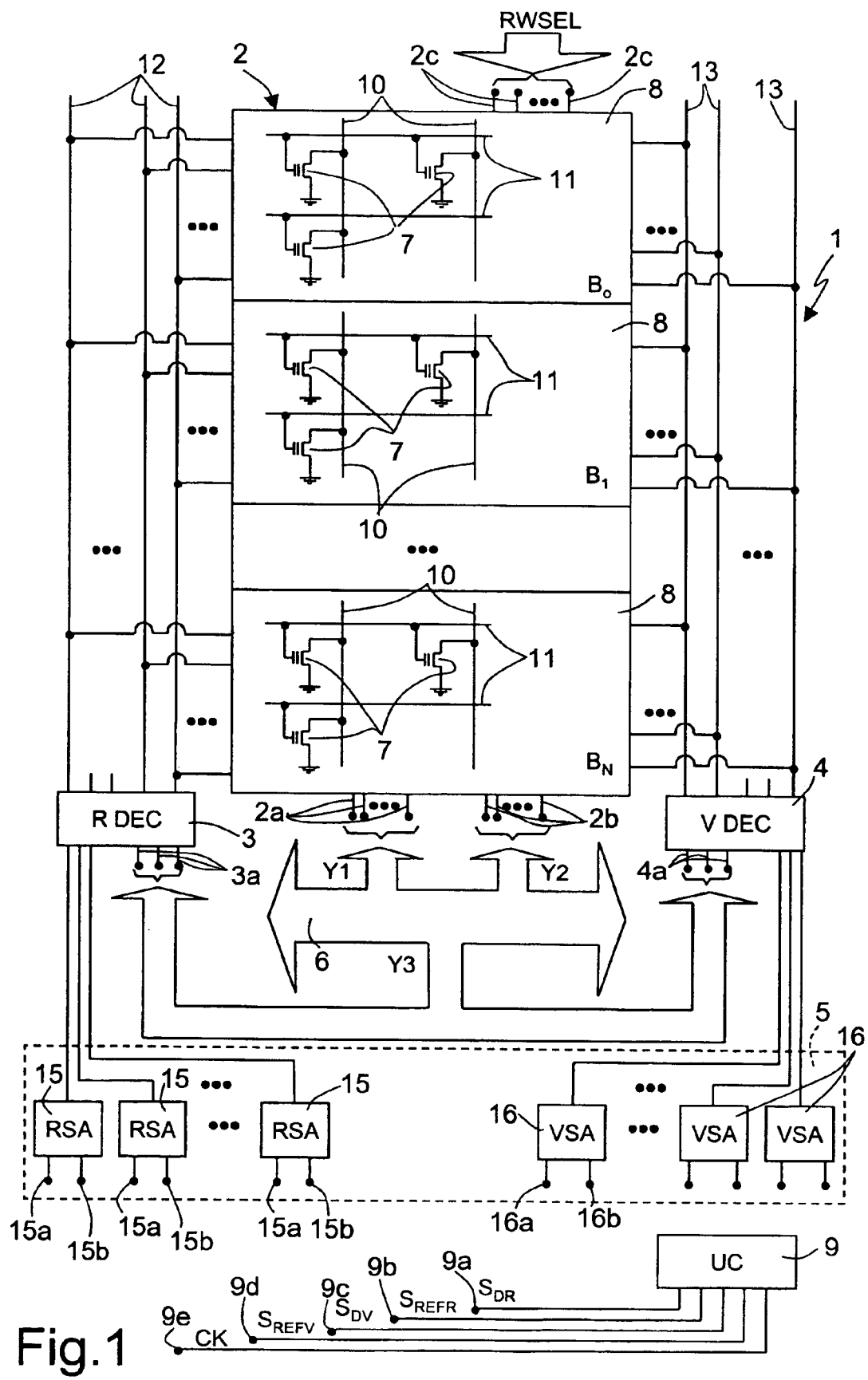
FIG. 1 illustrates a simplified block diagram of a memory device according to a first embodiment of the present invention.

With reference to FIG. 1, a nonvolatile memory device 1 comprises a memory array 2, a read column decoder 3, a verify column decoder 4, a read circuit 5, an address bus 6, and a control unit 9.

The memory array 2 comprises a plurality of cells 7, divided into a plurality of memory banks 8 and organized into rows and columns; by way of example, the memory banks 8 are sixteen. In greater detail, within a same memory bank 8, cells 7 arranged on a same column have respective drain terminals connected to a same local bitline 10 and cells arranged on a same row have respective gate terminals connected to a same wordline 11. In addition, each of the memory banks 8 has a first set of outputs, connected to the read column decoder 3 through respective global read bit-lines 12, and a second set of outputs, connected to the verify column decoder 4 through respective global verify bitlines 13 (in one embodiment as described herein, the number of global read bitlines 12 is equal to the number of global verify bitlines 13, but they may be different in number if desired). The wordlines 11 are connected to a row decoder (of a known type and not illustrated herein for simplicity). The global verify bit lines are used during the writing operation.

The memory array 2 moreover has: first and second address inputs 2a, 2b, connected to the address bus 6 and receiving a plurality of first-level address signals Y1 and second-level address signals Y2, respectively; and a plurality of read/write selection inputs 2c, which receive read/write selection signals $RWSEL_0$, $RWSEL_1$, ..., $RWSEL_K$, which indicate the operative access modality to the cells 7. In particular, K is the number of read/write selection inputs 2c and is equal to the number of global read bitlines 12.

The read circuit 5 comprises a plurality of read sense amplifiers 15 and a plurality of verify sense amplifiers 16. In particular, the read sense amplifiers 15 are connected to respective outputs of the read decoder 3, while the verify sense amplifiers 16 are connected to respective outputs of the verify decoder 4. In addition, the read column decoder 3 and the column decoder 4 have respective inputs 3a, 4a connected to the data bus 6 and receiving a plurality of third-level address signals Y3. In addition, the control unit 9 has: read driving outputs 9a, which are connected to respective driving inputs 15a of the read sense amplifiers 15 and supply read driving signals $S_{DR}$; read reference outputs 9b, which are connected to respective reference inputs 15b of the read sense amplifiers 15 and supply read reference signals $S_{REFR}$; verify driving outputs 9c, which are connected to respective driving inputs 16a of the verify sense amplifiers 16 and supply verify driving signals $S_{DV}$; verify reference outputs 9d, which are connected to respective reference inputs 16b of the verify sense amplifiers 16 and supply verify reference signals $S_{REFV}$; and a timing output 9e, which supplies a timing signal CK. In particular, the verify driving signals $S_{DV}$ are synchronous with the timing signal CK, while the read driving signals $S_{DR}$ are asynchronous.

In practice, whenever a read/write operation is required, the read column decoder 3 selects a set of global read bitlines 12 on the basis of the third-level address signals Y3 and connects them to a respective read sense amplifier 15; likewise, the verify column decoder 4 selects a set of global verify bitlines 13 on the basis of the third-level address signals Y3 and connects them to respective verify sense amplifiers 16.

Figure 2:
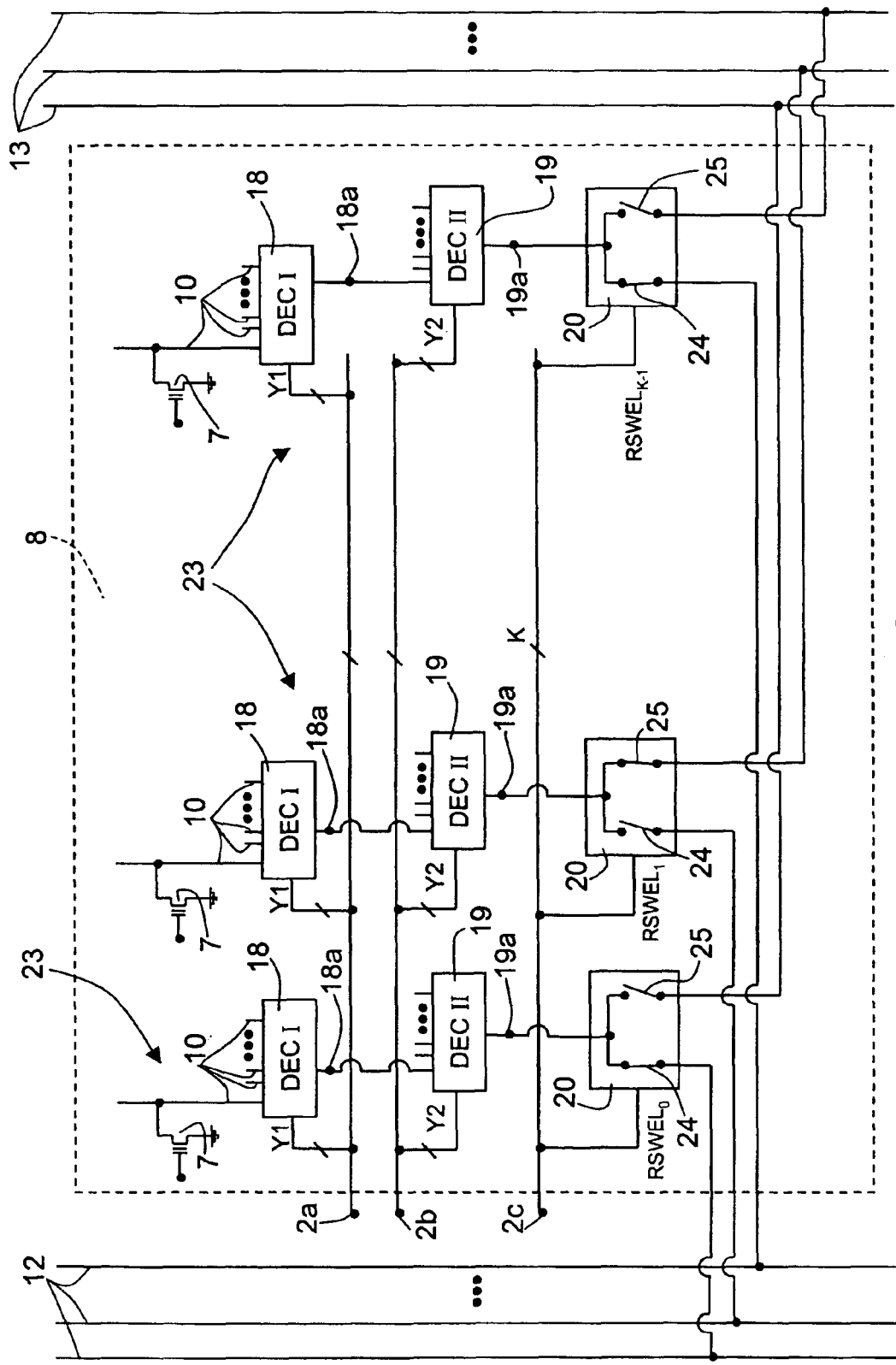
FIG. 2 illustrates a more detailed block diagram of a part of the block diagram of FIG. 1.

As illustrated in detail in FIG. 2, in addition to the respective cells 7 and local bitlines 10, each memory bank 8 comprises a plurality of first-level local decoders 18, second-level local decoders 19 and read/write selectors, which, hereinafter, are referred to as R/W selectors 20.

Each of the first-level local decoders 18, of a per se known type, has a plurality of selection inputs, connected to respective local bitlines 10, and a plurality of control inputs, which form the first address inputs 2a of the memory array 2; consequently, each of the first-level local decoders 18 receives the first-level address signals Y1.

Each of the second-level local decoders 19, which are also of a known type, has a plurality of selection inputs, connected to outputs 18a of respective first-level local decoders 18, and a plurality of control inputs, which form the second address inputs 2b of the memory array 2; consequently, each of the second-level local decoders 19 receives the second-level address signals Y2.

In practice, each memory bank 8 comprises a plurality of local decoding branches 23, each of which comprises a second-level local decoder 19 and the local bitlines 10 and the first-level local decoders 18 dependent upon this second-level local decoder 19. At each read/write operation, each local decoding branch 23 selects a local bitline 10 on the basis of the values of the first-level and second-level address signals Y1, Y2.

Each R/W selector 20 has an input, connected to an output 19a of a respective second-level local decoder 19; a first output, connected to a respective global read bitline 12; a second output, connected to a respective global verify bitline 13; and a control terminal, connected to a respective read/write selection input 2c of the memory array 2 and receiving a respective of the read/write selection signals $RWSEL_0$, $RWSEL_1$, ..., $RWSEL_K$. The R/W selectors 20 are consequently associated to respective sets of cells 7 and can be controlled individually and independently of one another.

In greater detail, each R/W selector 20 preferably comprises a read selector 24 and a write selector 25, for example made of MOS transistors. The read selector 24 and write selector 25 of each R/W selector 20 have respective first terminals in common, connected to the output 19a of the respective second-level local decoder 19, and second terminals, one of which forms the first output and the other the second output of the R/W selector 20. In addition, the read selector 24 and the write selector 25 are controlled in phase opposition according to the value of the respective read/write selection signal $RWSEL_0$, $RWSEL_1$, ..., $RWSEL_K$. In practice, when the read/write selection signal $RWSEL_0$, $RWSEL_1$, ..., $RWSEL_K$ supplied to one of the R/W selectors 20 assumes a read value, for example, a high value, the corresponding read selector 24 is closed, while the write selector 25 is open; instead, When the read/write selection signal $RWSEL_0$, $RWSEL_1$, ..., $RWSEL_K$ has a write value (low), the read selector 24 is open and the write selector 25 is closed. In this way, the output 19a of each second-level local decoder 19 is alternately connectable to a global read bitline 12 and to a global verify bitline 13 through the respective R/W selector 20, according to the operative access modality indicated by the respective read/write selection signal $RWSEL_0$, $RWSEL_1$, ..., $RWSEL_K$.

As mentioned previously, when a read/write operation of the memory array 2 is required, each local decoding branch 23 of the memory banks 8 addresses a respective local bitline 10 according to the first-level and second-level address signals Y1, Y2 and connect it to the respective R/W selector 20. In turn, the R/W selector 20 connects the respective addressed local bitline 10 (and the cells 7 associated thereto) to a global read bitline 12 or a to a global verify bitline 13 according to the value of the respective read/write selection signal $RWSEL_0$, $RWSEL_1$, ..., $RWSEL_K$.

In greater detail, when it is necessary to execute a normal reading operation of the cells 7 addressed by one of the local decoding branches 23, the corresponding read/write selection signal $RWSEL_0$, $RWSEL_1$, ..., $RWSEL_K$ is set at the read value. In this case, in practice, the addressed cells 7 are connected to the read column decoder 3 through the global read bitlines 12; furthermore, according to the third-level address signals Y3, the read column decoder 3 selects and connects a preset number of global read bitlines 12 to respective read sense amplifiers 15.

When the cells 7 addressed by one of the local decoding branches 23 is to be verified after programming or erasing, the respective read/write selection signal $RWSEL_0$, $RWSEL_1$, ..., $RWSEL_K$ is set at the write value. The addressed cells 7 are consequently connected to the verify column decoder 4 through the global verify bitlines 13. On the basis of the third-level address signals Y3, the verify column decoder 4 selects and connects a preset number of global verify bitlines 13 to respective verify sense amplifiers 16. At a same instant, the read/write selection signals $RWSEL_0$, $RWSEL_1$, ..., $RWSEL_K$ may clearly assume values different from one another, and consequently normal reading operations or verifying operations after writing are altogether independent and may be executed simultaneously.

From the above, it is evident that the invention enables simultaneous read/write access to be exploited in an extremely effective and flexible way. In fact, each local decoding branch 23 can be connected both to the global read bitlines 12 and to the global verify bitlines 13, independently of the other local decoding branches 23. Consequently, it is always possible to gain access simultaneously to cells 7 belonging to distinct local decoding branches 23 for reading and writing, even if the cells 7 belong to the same memory bank 8. In addition, the overall dimensions of the device 1 are contained and are substantially independent of the fractioning level of the memory array 2. In fact, the described memory device 1 comprises just one bank of read sense amplifiers 15 and just one bank of verify sense amplifiers 16, whatever the number of memory banks 8 and of local decoding branches 23.

Figure 3:
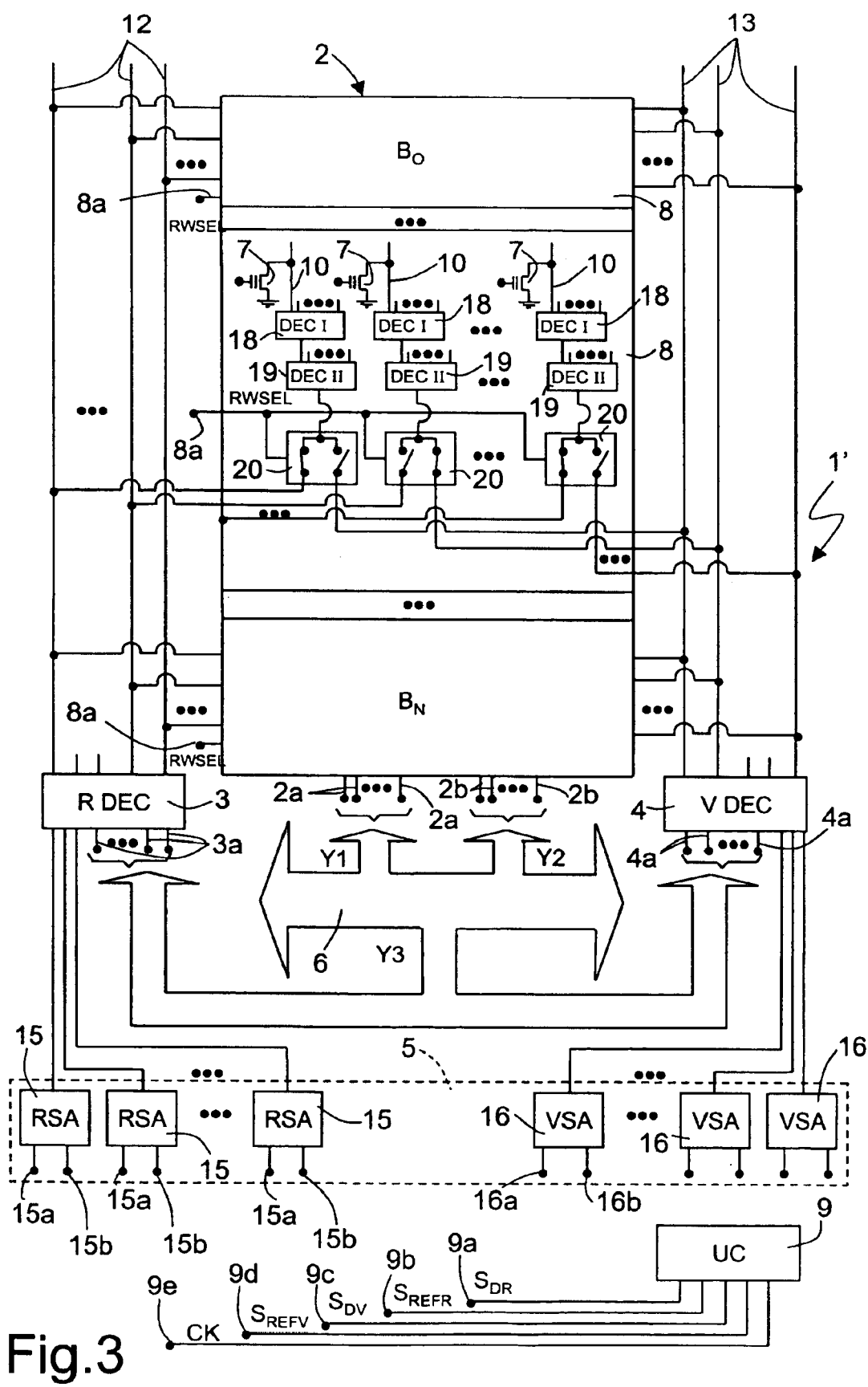
FIG. 3 is a simplified block diagram of a memory device according to a second embodiment of the present invention.

A different embodiment of the invention is illustrated in FIG. 3, where parts equal to those already illustrated are designated by the same reference numbers. In this case, in a nonvolatile memory device 1', each memory bank 8 is provided with a respective read/write selection input 8a, to which a respective read/write selection signal RWSEL is supplied; furthermore, all the control terminals of the R/W selectors 20 of a same memory bank 8 are connected to its read/write selection input 8a and thus receive the same signal. All the R/W selectors 20 of a same memory bank 8 are thus controlled in phase. In this way, all the cells 7 addressed by the local decoding branches 23 of a same memory bank 8 are connected either to the global read bitlines 12, for a read operation, or to the global verify bitlines 13, for a verify operation after writing. However, while the global read bitlines 12 are used by the cells 7 of a memory bank 8, the global verify bitlines 13 may be connected to cells 7 belonging to a different memory bank 8 (supplied to the memory banks 8 are, in fact, read/write selection signals RWSEL which are independent of one another).

Also in this case, then, it is advantageously possible to gain access simultaneously for reading and writing the memory array 2, with the sole constraint that the cells 7 to be read and those to be verified belong to distinct memory banks 8. Since the memory array 2 may be easily fractioned into a large number of memory banks 8 (sixteen, in the examples described), the device 1' maintains in any case a considerable flexibility in the simultaneous access for reading and writing. In other words, dual working can be exploited in an efficient way. In addition, the number of inputs of the memory array 2 is reduced and the generation of the read/write selection signals is simplified.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

Finally, it is clear that modifications and variations may be made to the memory device described herein, without thereby departing from the scope of the present invention.

What is claimed is:

1. A nonvolatile memory device with simultaneous read/write, comprising:
    a memory array, having a plurality of cells organized into memory banks; and
    a plurality of first sense amplifiers;
    a plurality of second sense amplifiers;
    a plurality of R/W selectors associated with respective sets of said cells and connecting said cells of said respective sets of said cells alternately to said first sense amplifiers and to said second sense amplifiers.

2. The device according to claim 1, wherein each of said memory banks comprises a respective plurality of said R/W selectors.

3. The device according to claim 1, wherein said memory banks comprise respective local decoding branches, each local decoding branch being connected to a respective one of said R/W selectors.

4. The device according to claim 3, wherein each of said local decoding branches comprises at least one first local decoder and a plurality of local bitlines, connected to said first local decoder.

5. The device according to claim 4, wherein each of said local decoding branches comprises a plurality of said first local decoders and at least one second local decoder, connected to said first local decoders and to the respective said R/W selector.

6. The device according to claim 1, wherein said R/W selectors can be controlled independently of one another.

7. The device according to claim 1, wherein said R/W selectors belonging to a same of said memory banks are controlled in phase.

8. The device according to claim 1, further comprising:
    first and second global bitlines connecting said R/W selectors to said first and, respectively, to said second sense amplifiers.

9. The device according to claim 8, wherein said R/W selectors have first outputs connected to respective said first global bitlines and second outputs connected to respective said second global bitlines.

10. The device according to claim 8, further including:
    a first column decoder, arranged between said first global bitlines and said first sense amplifiers, and a second column decoder, arranged between said second global bitlines and said second sense amplifiers.

11. The device according to claim 1, further including:
    a control unit having first outputs, connected to said first sense amplifiers and supplying first driving signals and first reference signals, second outputs connected to said second sense amplifiers and supplying second driving signals and second reference signals, and a third output supplying a timing signal.

12. The device according to claim 11, wherein said second driving signals are synchronous with said timing signal.

13. An integrated memory array that provides simultaneous reading and writing to individual memory cells within the array, comprising:
    at least two memory banks within said array, each memory bank having a plurality of memory cells therein and both memory banks being adjacent to each other on the same integrated circuit;
    a set of global output bit lines coupled to each memory bank;
    a set of global verify bit lines coupled to each bank of the memory array;
    a read address decoder circuit coupled to address a memory cell within each bank of the memory array to permit reading of a memory cell within the array; and
    a verify address decoder circuit coupled to address a memory cell with the bank of the memory array to permit verifying the status of data during a write operation within each memory bank.

14. The integrated circuit according to claim 13 wherein the read address decoder and the verify address decoder are completely independent from each other in structure for each memory bank of the array.

* * * * *